United States Patent [19]

Hecht

[11] Patent Number: 4,644,301

[45] Date of Patent: Feb. 17, 1987

[54] REDUNDANCY SYSTEM AND SWITCHING NETWORK

[75] Inventor: Martin A. Hecht, East Brunswick, N.J.

[73] Assignee: RCA Corporation, Princeton, N.J.

[21] Appl. No.: 793,146

[22] Filed: Oct. 31, 1985

[51] Int. Cl.$^4$ .......................... H01P 1/10; H03F 3/68
[52] U.S. Cl. ................. 333/101; 330/124 D; 330/295; 333/1; 333/262; 455/8
[58] Field of Search .................. 333/101–108, 333/258, 259, 262, 1, 2, 3; 307/23, 64, 65; 330/124 D, 295; 455/3, 133, 8, 17; 381/81; 358/181, 188; 340/825.79, 825.8, 825.85; 179/18 G, 18 GA, 18 GB, 18 GC, 18 GD, 18 GE, 18 GF; 370/53, 54; 361/350, 351

[56] References Cited

U.S. PATENT DOCUMENTS

| | | |
|---|---|---|
| 3,111,624 | 9/1963 | Farkas ................................ 455/8 |
| 3,600,682 | 8/1971 | Yoshimoto et al. ................ 333/101 |
| 4,061,989 | 12/1977 | Petrelis ............................... 333/101 |
| 4,070,637 | 1/1978 | Assal et al. ......................... 333/105 |
| 4,198,611 | 4/1980 | Eng ..................................... 333/105 |

Primary Examiner—Marvin L. Nussbaum
Attorney, Agent, or Firm—Joseph S. Tripoli; Robert L. Troike; Robert Ochis

[57] ABSTRACT

A redundancy switching system which provides four reserve devices is disclosed which is suitable for use with from eight to twelve channels. The switches in the input switching network of this redundancy system are connected in first and second sections. Each section includes a ring of switches and two switches connected as appendages to the ring. Only as many switches are needed to control the input connection to the redundant devices as there are redundant devices. A similar number of switches are needed to control the output connection of the active devices.

12 Claims, 11 Drawing Figures

REDUNDANCY SYSTEM AND SWITCHING NETWORK

The present invention relates to redundancy switching systems and more particularly to such systems which provide connections which enable communication channels to be diverted from failed devices to operative reserve devices.

Redundancy refers to the presence of alternative or reserve (redundant) components which can be substituted for failed similar components without shutting down the redundant system for physical replacement of the failed component.

Switches and their connection paths can consume substantial weight and volume, especially in waveguide systems. In communication satellites, it is desirable to provide the smallest number of reserve devices which will be adequate to the purpose and interconnect them into the overall communication system through a small light-weight switching system.

One type of transfer switch which is available for use in redundancy systems has four ports which may be identified as 1, 2, 3 and 4 and has one through position and two transfer positions. In the through position, the switch provides a connection between its port 1 and its port 3. In one of the transfer positions its port 1 is connected to its port 2 and its port 3 is connected to its port 4. In the other transfer position its port 1 is connected to its port 4 and its port 3 is connected to its port 2.

In communication satellites redundancy is considered essential because of the impracticability of physically removing a failed component and installing a working component in its place. The most common components to fail in modern satellites are active components such as amplifiers, especially traveling wave tube amplifiers (TWTAs). These amplifiers are sufficiently important and have a high enough potential for failure that redundant reserve devices are normally provided. At present, a number of reserve devices which is equal to about one third of the number of channels is considered adequate provided that the reserve devices provide redundancy for any combination of amplifier failures up to the number of reserve devices. Thus, four reserve devices are considered sufficient for communication systems with as many as twelve channels, when an appropriate switching system is provided.

For simplicity and clarity of expression, the portion of a system for which redundancy is provided will be referred to generally as a device. This "device" may be a single component or a series of components such as amplifiers and frequency converters.

SUMMARY OF THE INVENTION

The present redundancy system has between eight and twelve input ports and provides four reserve devices. Connection of the input ports of the redundancy system to these devices is controlled by a switching network containing only as many transfer switches as there are total devices. That switching network has first and second interconnected sections, each of which includes at least six and not more than eight of the transfer switches. Each of the transfer switches has four ports identified as 1, 2, 3 and 4.

In each section, all but two of the transfer switches are connected together, even-numbered port to even-numbered port, to form a ring. The two transfer switches in each section which are not connected in that section's ring are referred to as appendage switches. Two of the transfer switches within each ring are referred to as interconnection switches. Each of these interconnection switches has a first one of its odd-numbered ports connected to a first one of the odd-numbered ports of a corresponding interconnection switch in the ring in the other section.

Those transfer switches in the rings which are not interconnection switches are referred to as intermediate switches. Each of the intermediate switches is connected to at least one of the interconnection switches in its own ring. Depending on the number of switches in the rings, some intermediate switches may connect to both interconnection switches in its ring. Each of the interconnection switches is connected to two intermediate switches in its own ring.

Each of the appendage switches has a first one of its even-numbered ports connected to the second one of the odd-numbered ports of an interconnection switch in its own section.

Each of the appendage and intermediate switches in the switching system has a first one of its odd-numbered ports connected as one of the input ports of the redundancy system. The second odd-numbered port of each of the intermediate switches, the second odd-numbered port and the second even-numbered port of each of the appendage switches are each connected to a different one of the devices. So long as no more than four of the devices fail, the switching network can be set to connect a working device to each of the input ports.

Preferably, a second switching network which is a mirror image of the input switching network controls the connection of the devices to output ports of the redundancy system.

DETAILED DESCRIPTION

Figures 1A, 1B, 1C, 1D:
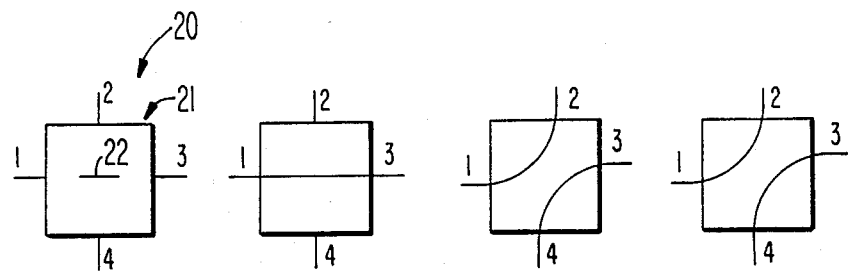
FIGS. 1A–1D illustrate the symbol used for the switches in the other FIGURES and the positions to which the switches may be set.

FIGS. 1A–1D illustrate the symbol 20 used in the drawings for the type of transfer switches used in the illustrated embodiments of redundancy systems in accordance with this invention. These switches have four ports identified as 1, 2, 3, and 4. For use in the communication channels of a communication satellite these switches are RF switches and may be of a waveguide, coaxial or other type as is appropriate to the rest of the system. One type of commercially available transfer switch which may be used in a waveguide embodiment of this redundancy system is the Sector Motor Industries type SN 75-400 three-position waveguide RF switch. These switches have one through position and two transfer positions. In the through position, the opposite ports 1 and 3 are connected and ports 2 and 4 are unconnected. In a first transfer position port 1 is connected to port 2 and port 3 is connected to port 4. In the second transfer position, port 1 is connected to port 4 and port 3 is connected to port 2. In FIG. 1A the switch symbol 20 is shown in the form that is used when no particular switch position or setting is being indicated. The dash 22 located within the square 21 of this symbol is aligned with the odd-numbered ports in order to indicate orientation of the switch, i.e. which ports will be connected to each other when the switch is in the through position.

In FIG. 1B the switch symbol 20 is shown in the form that is used to show that the switch is actually set in its through position in which port 1 is connected to port 3.

In FIG. 1C the switch symbol 20 is shown in the form that is used to show that the switch is in its first transfer position in which port 1 is connected to port 2 and port 3 is connected to port 4.

In FIG. 1D the switch symbol 20 is shown in the form that is used to show that the switch is in its second transfer position in which port 1 is connected to port 4 and port 2 is connected to port 3.

Figure 2:
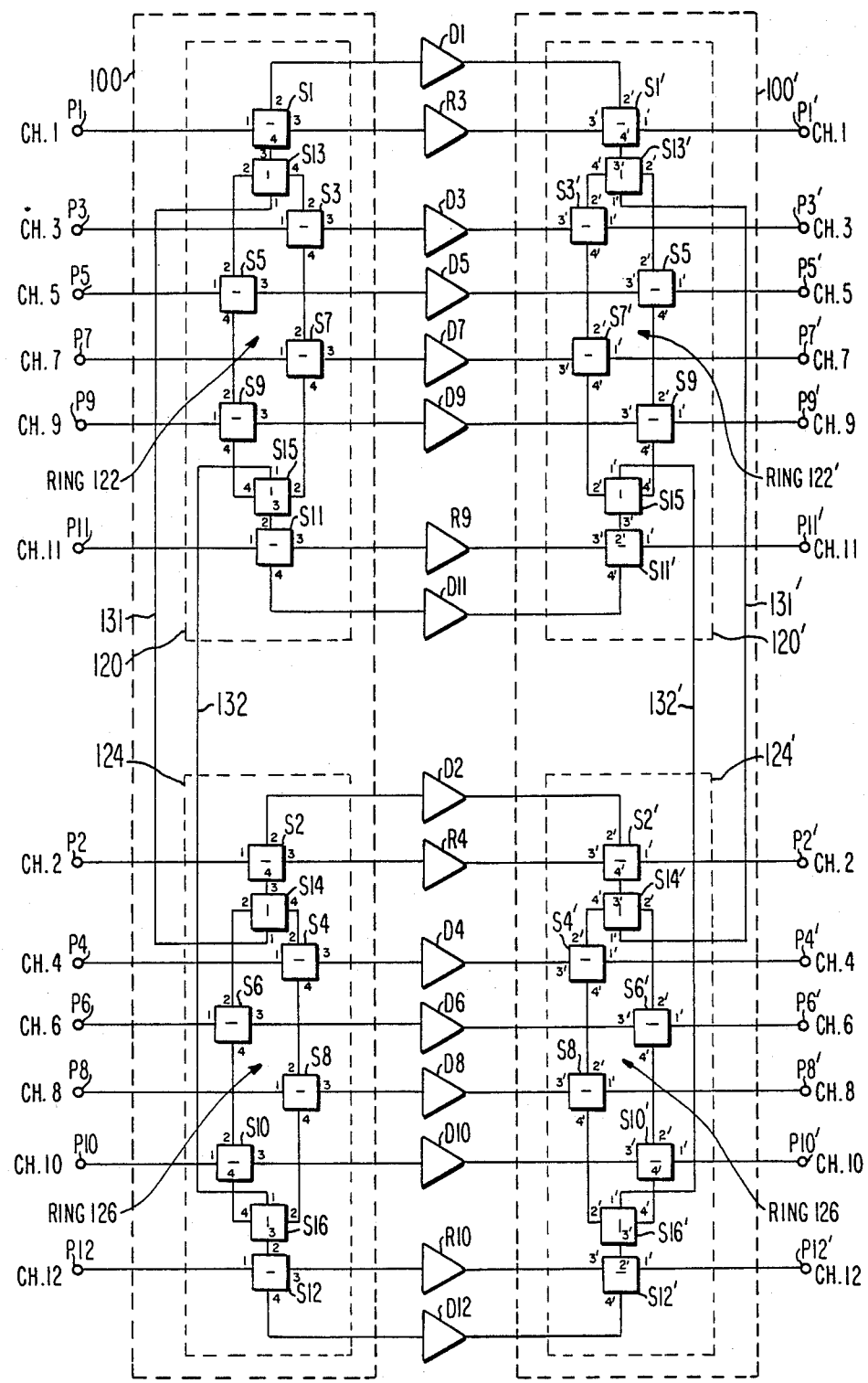
FIG. 2 is a schematic illustration of a redundancy system having twelve channels and sixteen devices in accordance with the present invention.

FIG. 2 illustrates an embodiment of the inventive redundancy system which provides twelve communication channels (numbered 1-12) with sixteen redundant devices (i.e. twelve primary devices and four reserve devices). This redundancy system includes an input switching network 100 and for connecting the incoming portions of the communication channels to selected ones of the redundant devices and a mirror image output switching network 100' for connecting those selected devices to the outgoing portions of the communication channels.

The twelve input ports to the redundancy system are numbered in succession P1 through P12, where the initial P indicates that the reference numeral refers to one of the ports of the redundancy system. The switches of the input switching network 100 are numbered S1 through S16, where the initial S indicates that the reference numeral refers to one of the switches. The switches of the mirror image output switching network 100' are numbered S1' through S16'. The output ports of the system are numbered P1' through P12'. The primary devices are numbered D1 through D12, where the initial D indicates that the reference numeral refers to one of the primary devices. The four reserve devices are numbered R3, R4, R9, and R10, where the initial R indicates that the reference numeral refers to one of the reserve devices. The particular numerical values in the reserve device numbers will be explained subsequently. The primary and reserve devices are identical in function so that any reserve device may be substituted for any primary device. However, where different channels operate at different frequencies as in many satellite communication systems, the devices may have different frequencies at which their operation is optimum.

The devices D1-D12, R3, R4, R9 and R10 may be as simple as a single component or as complicated as necessary for the particular system and may, for instance, each comprise a series connection of amplifiers, down converters and so forth. In the drawings, the devices D1-D12, R3, R4, R9, and R10, are illustrated as simple amplifiers for drawing clarity.

Figure 3:
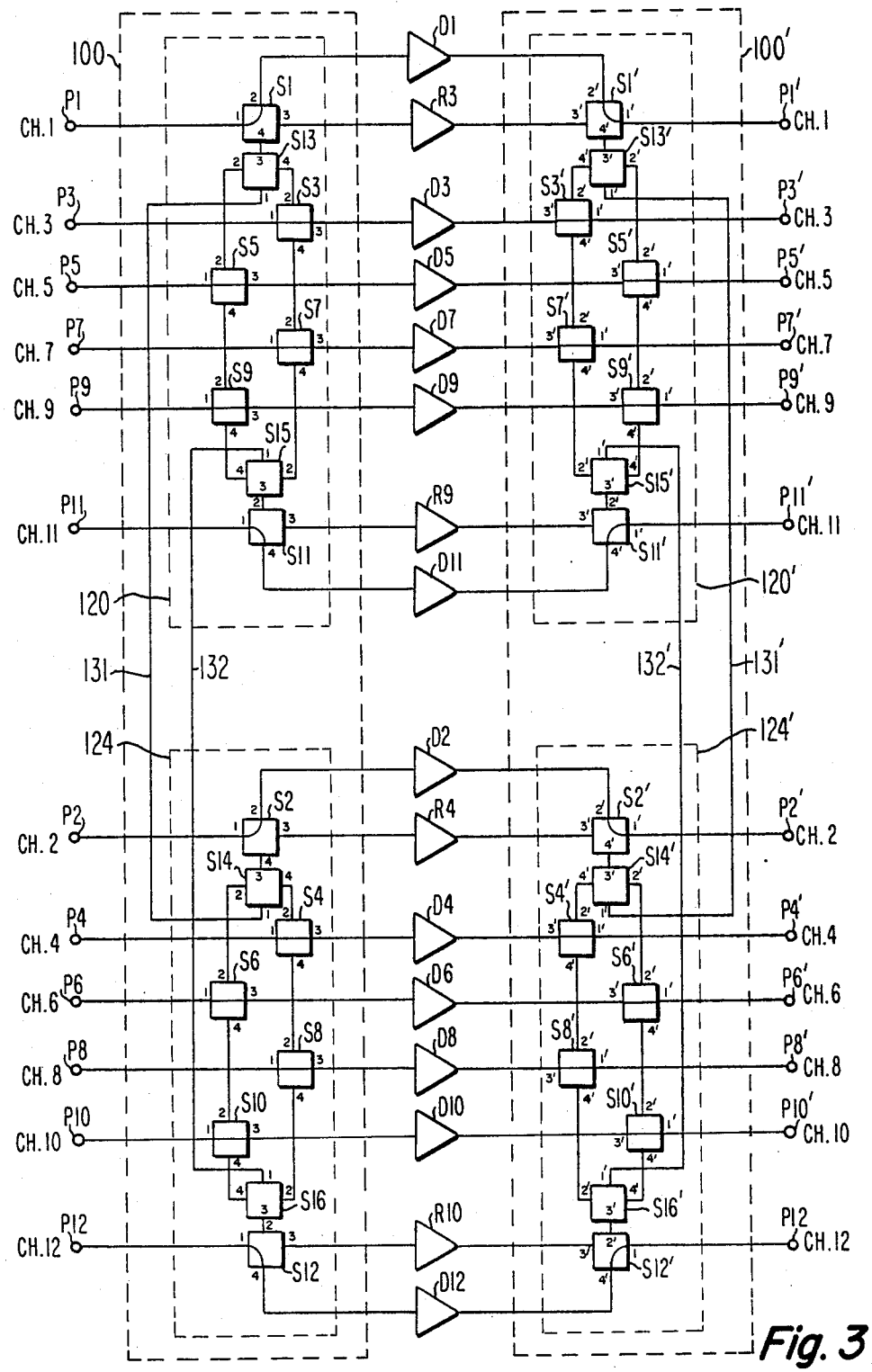
FIG. 3 is a schematic illustration of the redundancy system of FIG. 2 with the switches set for operation using the primary devices.
Figure 4:
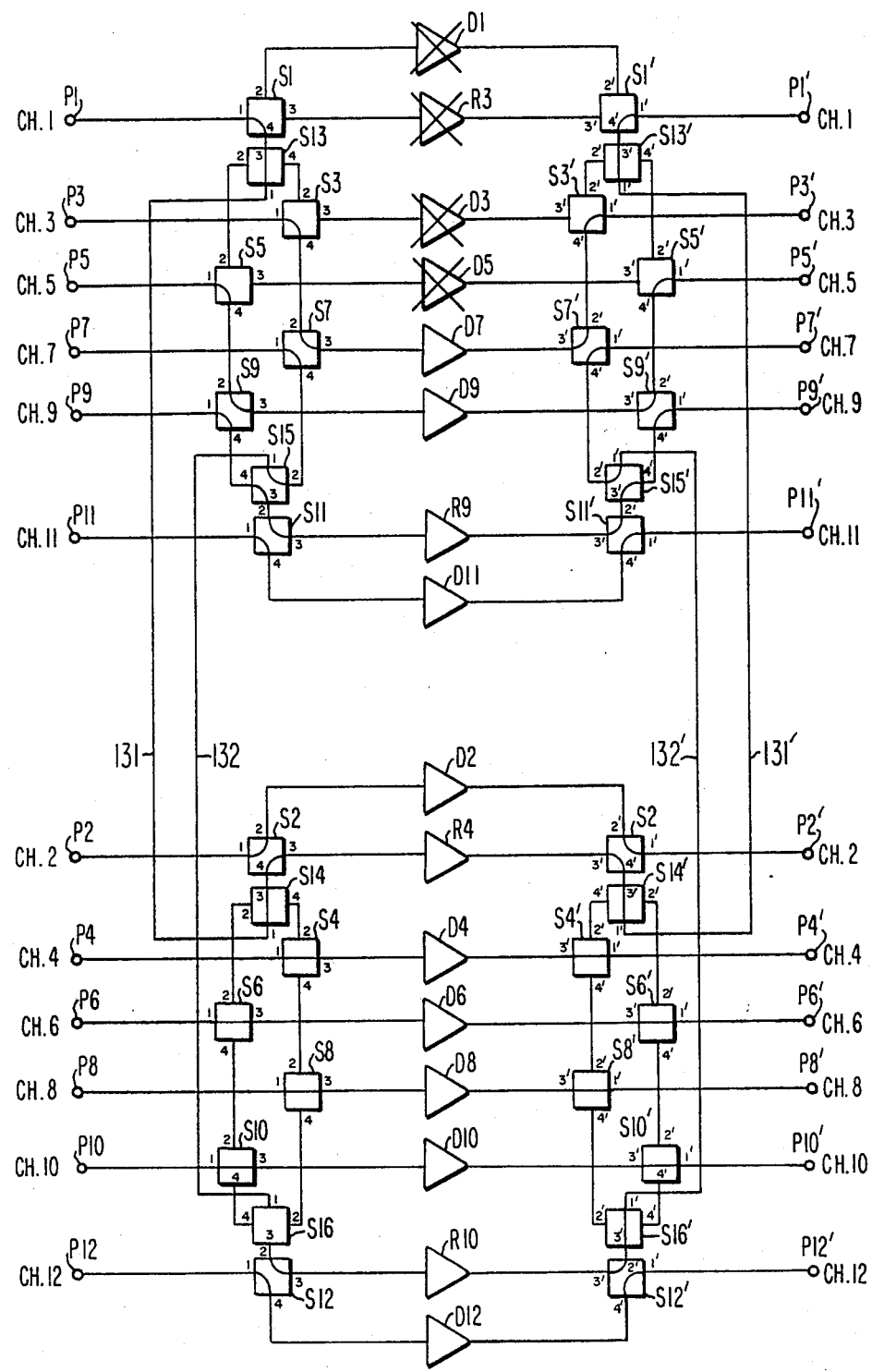
FIG. 4 illustrates the system of FIG. 3 reconfigured to accommodate four closely associated devices which have failed.

To simplify tracing of the active RF circuit paths in FIGS. 3 and 4, only those switch connections which are part of active RF circuit paths are shown in FIGS. 3 and 4. As shown in FIGS. 1C and 1D, each of the switches provides two circuit paths when it is in a transfer position, thus, each of the appendage switches S1, S2, S11, S12, S1', S2', S11' and S12' provides two circuit paths when it is in transfer position in which it is set in FIG. 3. However, in accordance with the above convention, only one of these two circuit paths is shown, in FIG. 3, since the omitted circuit paths are not part of any of the active RF circuit paths. Since switches S13-S16 and S13'-S16' are not part of any active RF circuit paths in FIG. 3, no specific positions are shown for these switches in that FIGURE.

The input switch network 100 as illustrated in FIGS. 2-4 has an upper section 120 and a lower section 124 in the FIGURES. In the twelve channel, sixteen device embodiment shown in FIGS. 2 and 3 each of the sections includes eight of the sixteen input switches. The odd-numbered switches (S1, S3, S5, S7, S9, S11, S13 and S15) are in the upper section 120 and the even numbered switches are in the lower section 124. Within section 120 six of its eight switches (S3, S5, S7, S9, S13 and S15) are connected, via their even-numbered ports to form a ring 122. These six switches are connected in the order S3, S7, S15, S9, S5, S13 back to S3 to close the ring 122. Port 4 of switch S3 is connected to port 2 of switch S7, port 4 of switch S7 is connected to port 2 of switch S15, port 4 of switch S15 is connected to port 4 of switch S9, port 2 of switch S9 is connected to port 4 of switch S5, port 2 of switch S5 is connected to port 2 of switch S13 and port 4 of switch S13 is connected to port 2 of switch S3. The other two switches (S1 and S11) are connected as appendages to ring 122 and are therefore referred to as appendage switches.

In a similar manner in section 124 six of its eight switches (S4, S6, S8, S10, S14 and S16) are connected via their even-numbered ports in the order S4, S8, S16, S10, S6, S14 back to S4 to form a ring 126 and the other two switches (S2 and S12) are connected as appendages to ring 122.

Two of the switches in each ring (S13 and S15 in ring 122 and S14 and S16 in ring 126) are referred to as interconnection switches. Each interconnection switch in ring 122 has its port 1 connected to port 1 of a corresponding interconnection switch in ring 126. Thus, switch S13 is connected to switch S14 by a circuit path 131 and switch S15 is connected to a switch S16 by a circuit path 132.

Each of the appendage switches has a first one of its even-numbered ports connected to port 3 of an interconnection switch in its own section. In section 120, appendage switch S1 has its port 4 connected to port 3 of interconnection switch S13 and appendage switch S11 has its port 2 connected to port 3 of interconnection switch S15. Similarly, in section 124 appendage switch S2 has its port 4 connected to port 3 of interconnection switch S14 and appendage switch S12 has its port 2 connected to port 3 of interconnection switch S16.

These switches within the rings which are not interconnection switches are referred to as intermediate switches since each is connected between (intermediate) the interconnection switches in its own ring. Thus, in FIGS. 2 and 3 switches S3-S10 are intermediate switches. Each of the intermediate switches is connected to one of the interconnection switches in its own ring and each of the interconnection switches is connected to two intermediate switches in its own ring. Thus, each of the interconnection switches is connected only to other switches.

Each of the switches S1-S12 has its port 1 connected as the corresponding one of the twelve input ports P1-P12 of the redundancy system. Each of the intermediate switches S3-S10 has a corresponding (like-numbered) one of the devices D3-D10 connected to its port 3. The appendage switches S1 and S2, each have a corresponding device D1 and D2, respectively, connected to its port 2. The appendage switches S11 and S12 each have a corresponding device D11 and D12, respectively, connected to its port 4. The devices D1-D12 are the primary devices for the channels 1-12. The reserve devices (R3, R4, R9, and R10) are connected to port 3 of the respective appendage switches S1, S2, S11 and S12.

The switches S1'-S16' of output switching network 100' are connected in a network which is a mirror image of the network 100; that is, one in which the network 100 has been flipped over left to right in the FIGURE. Thus, network 100' includes two sections 120' and 124', two rings 122' and 126' and two circuit paths 131' and 132' which interconnect its sections. The ports of the output switches S1'-S16' are identified as 1', 2', 3' and 4' since they are sequentially numbered counter-clockwise in the FIGURE because of the mirror image relationship of the output part of the system to the input part of the system. Port 1' of each of the switches S1'-S12' is connected as the corresponding output port (P1'-P12') of the redundancy system. In order to provide communication channel continuity, each of the output switches (S1'-S16') is set to the same position as its corresponding input switch (S1-S16). In this way, twelve redundant channels are provided, each extending from a redundancy system input port P1-P12 to a corresponding redundancy system output port P1'-P12'.

In the absence of any failure of the primary devices D1-D12, the switches are preferably set as shown in FIG. 3. Switches S3-S10 are set in the through position in which their odd-numbered ports are connected to each other. The upper appendage switch in each section (S1, S2, S1' and S21)' is set in its first transfer position and the lower appendage switch in each section (S11, S12, S11' and S12') is set in its second transfer position and the setting of the switches S13-S16 and S13'-S16' is immaterial. None of the interconnection circuit paths 131, 132, 131' and 132' is part of an active RF circuit.

Each of the channels connected to a given half of a section (upper or lower half in the FIGURES) can be routed through the reserve device which is connected to the appendage switch connected in that half. Each can also be routed through the reserve device in the corresponding half of the other section (the upper halves correspond as do the lower halves). So long as no more than four of the sixteen devices fail, the input and output switching networks can be set to connect each of the twelve channels 1-12, through an operational device.

In FIG. 4, the system of FIG. 2 is illustrated with four devices (D1, R3, D3, and D5) at the top of FIG. 4 in a failed condition. The failure of these devices is indicated graphically by the large X drawn through the device symbol in FIG. 4. Such a failure (all of the devices connected to one half of a section) requires the most complex redistribution of channel connections for this switching system. The three channels 1, 3 and 5 connected to the upper half of section 120 must be reconnected to use devices outside of that half section. This reconnection involves setting interconnection switches S13, S14, S13' and S14' to their through position, setting interconnection switches S15 and S15' to their first transfer position, and resetting input switches S1, S3, S5, S7 and S9 and output switches S1', S3', S5', S7' and S9' to their second transfer position. The rest of the switches remain on their normal position in which they are shown in FIG. 2, although as shown in FIG. 4, the appendage switches S2, S2', S11, S11', S12 and S12' are each part of two RF circuits rather than only one RF circuit each as in FIG. 3. This reconnection results in channel 1 using the reverse device R4, channel 3 using device D7 and channel 5 using device D9. Devices D7 and D9 are made avaiable for use in channels 3 and 5, respectively, by shifting channels 7 and 9 to use reserve devices R10 and R9, respectively.

It will be noted that all of the interconnection circuit paths (131, 132, 131' and 132') between the upper and lower sections 120 and 124 and 120' and 124' are in RF use to transfer devices physically located in one section to operational use in a channel connected to input and output ports which are physically located in the other section. At the same time, a device connected to the lower portion of section 120 is transferred to use in a channel whose input and output ports are in the upper half of that section. This redundancy system accomplishes this transfer with only as many switches as there are active devices.

If channels 1-12 as illustrated in FIGS. 2-4 are assigned in sequence to sequentially adjacent frequency channels, then each of the devices only needs to be able to cover a segment of the entire frequency range of operation. In accordance with this feature, device R3 should be optimized for operation at the frequency used for channel 3, device R4 for use at the channel 4 frequency, device R9 for use at the channel 9 frequency and device R10 for use at the channel 10 frequency. Then, even in the worst case of device failures no device will have to handle a channel whose frequency is further than four channel frequencies away from its own optimum frequency, and that only happens when specific triplets of devices fail (failure of devices D3, R3 and R4 will, for example, cause channel 3 to be routed through device D7).

In operation of this redundancy system in a satellite, it is normal practice to utilize the devices D1, D2, D11 and D12 for the corresponding channels until they fail, since each of these devices is accessible only to that channel. It is only upon failure of one of these devices that the switch to which it is connected is reset to its through position to connect the associated reserve device R3, R4, R9 or R10, into its channel (1, 2, 11 or 12). The switches S3-S10 and S3'-S10' to which the remaining channels 3-10 connect are set in their through position so that the device of a given number is utilized in the channel of the same number. If one of the devices fails, then the transfer switches are reset to replace the failed device(s) and the replacement device(s) is turned on. However, if wear on the devices is relatively uniform with time and turning the devices on and off at widely spaced intervals does not have an adverse effect on their useful life, the reserve devices may be switched into active use to temporarily replace still functional devices in order to equalize the operating time of each of the devices D3–D10, R3, R4, R9, and R10.

Figure 5:
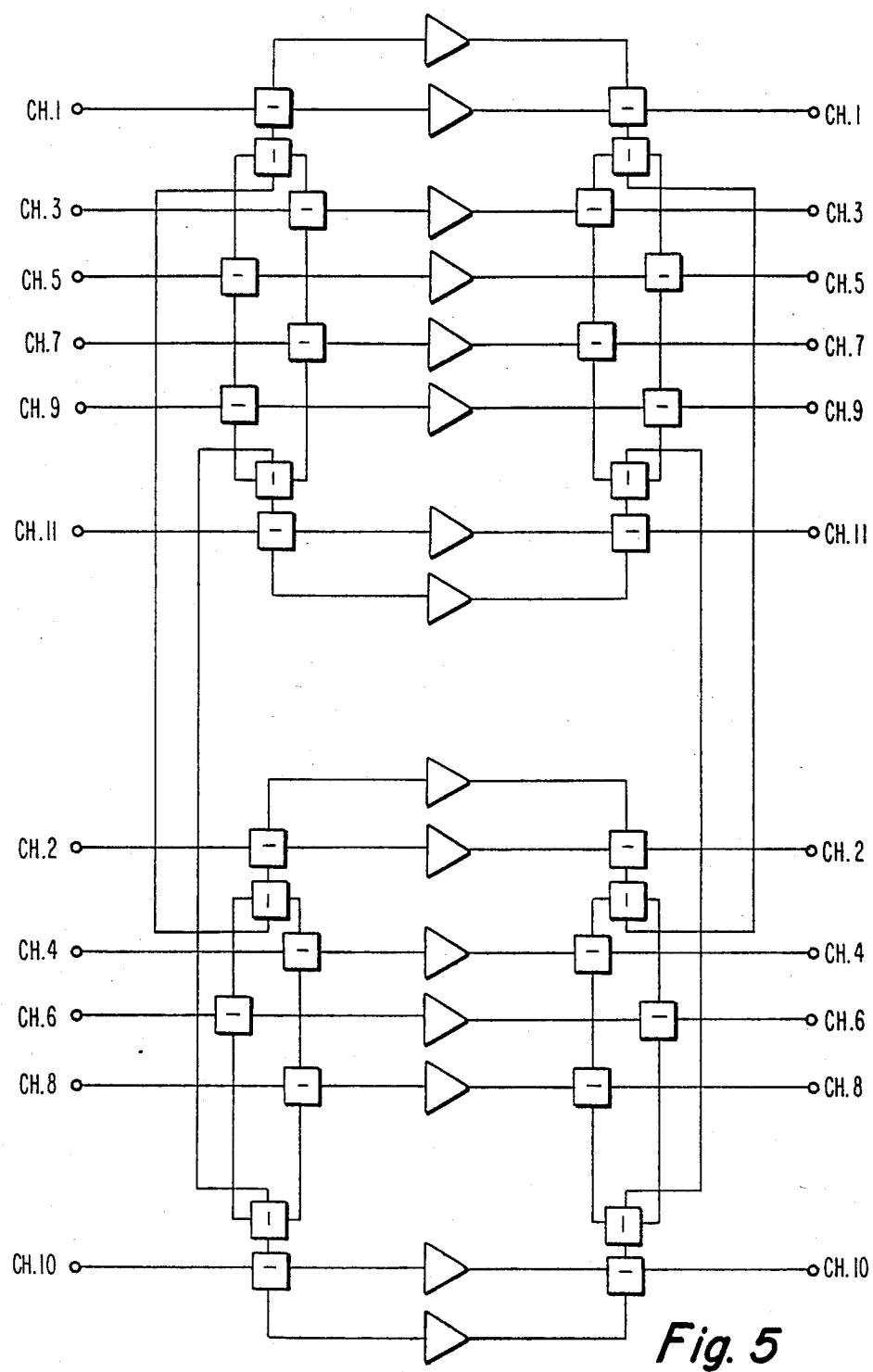
FIG. 5 illustrates a system similar to that in FIG. 2, but with eleven channels and fifteen devices.

The FIG. 2 system is a twelve channel system. This system can be modified to provide eleven channels with redundancy by eliminating the switches and devices of one of the channels of FIG. 2, the channel 10 is eliminated for example. This eliminates device D10 and switches S10 and S10′ and ports P10 and P10′ from the circuit of FIG. 2. Switches S10 and S10′ are replaced by short circuits which connect switch S6 to switch S16 and switch S6′ to switch S16′, respectively. This eleven channel embodiment is shown in FIG. 5.

Figure 6:
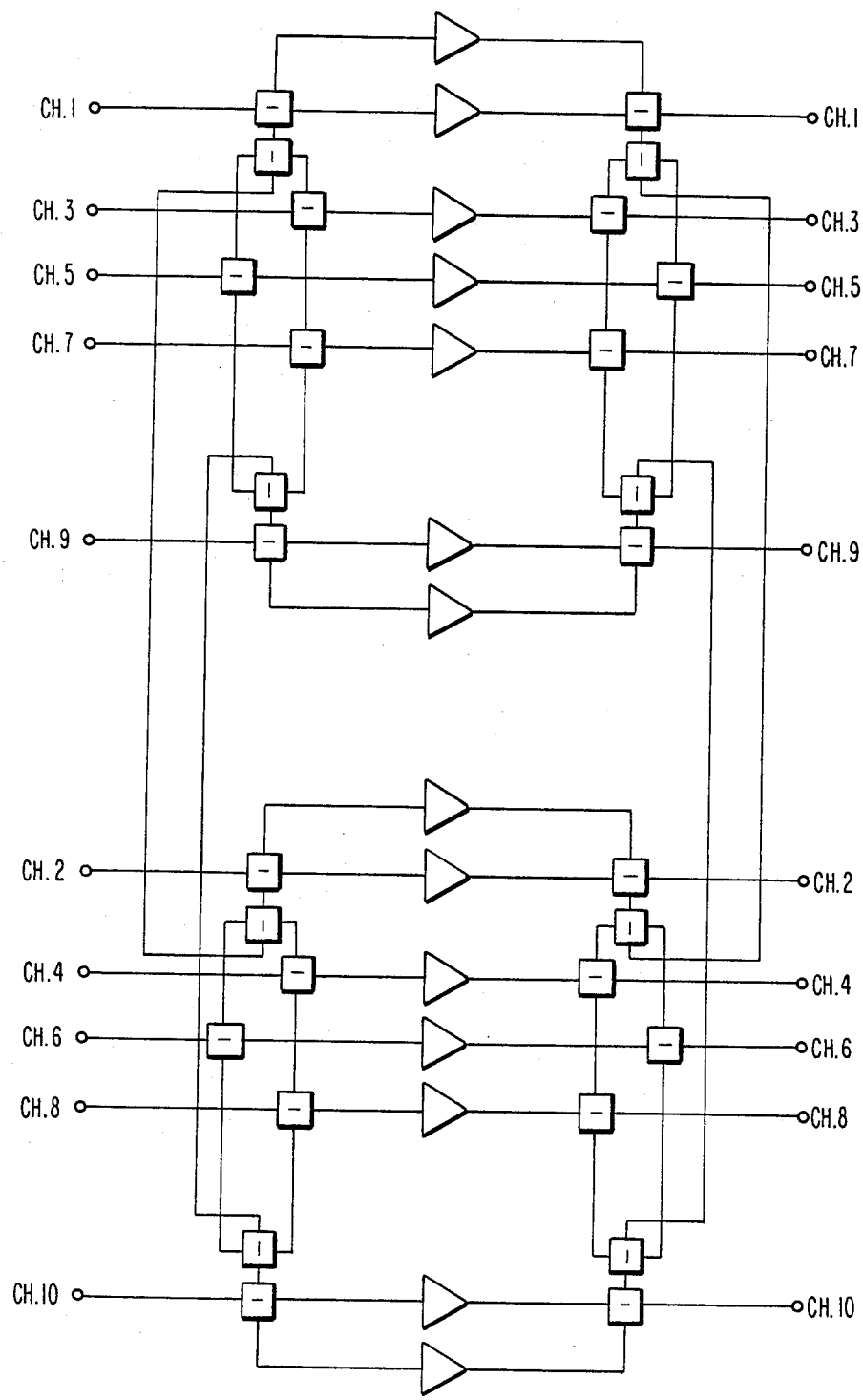
FIG. 6 is a schematic illustration of a redundancy system having ten channels and fourteen devices in accordance with the present invention.

A ten channel system may be provided in a similar manner by eliminating the switches (S9, S9′, S10, S10′ and devices D9 and D10 of channels 9 and 10 of FIG. 2. Such a ten channel redundancy system is shown in FIG. 6 where the associated switches and devices of channels 9 and 10 of FIG. 2 have been eliminated to leave ten channels.

Figure 7:
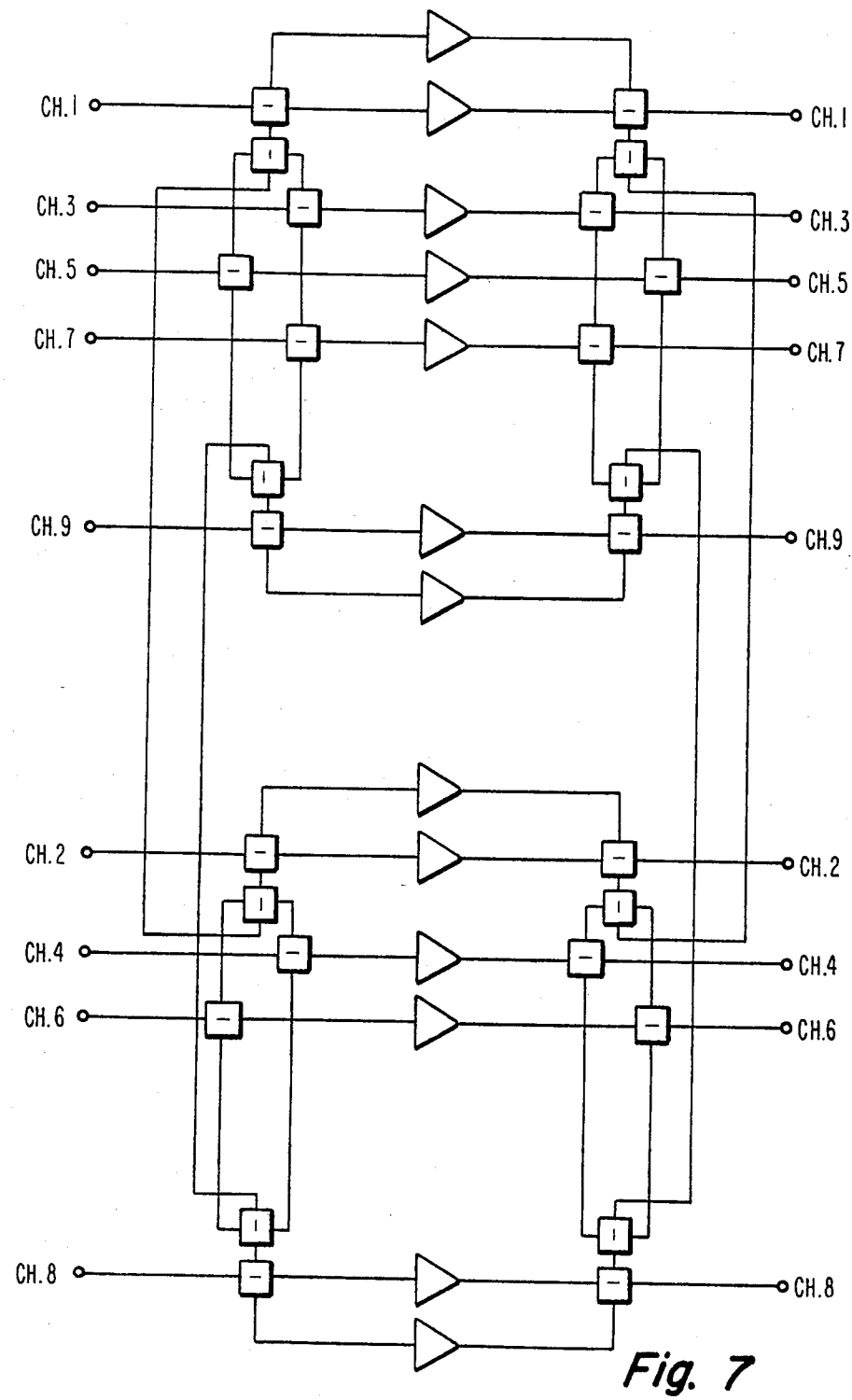
FIG. 7 is a schematic illustration of a redundancy system having nine channels and thirteen devices in accordance with the present invention.

A nine channel system may be provided by eliminating the switches and devices of channels 8, 9 and 10 of FIG. 2. Such a nine channel redundancy system is shown in FIG. 7 where the switches and devices of channels 8, 9 and 10 of FIG. 2 have been eliminated to leave nine channels.

Figure 8:
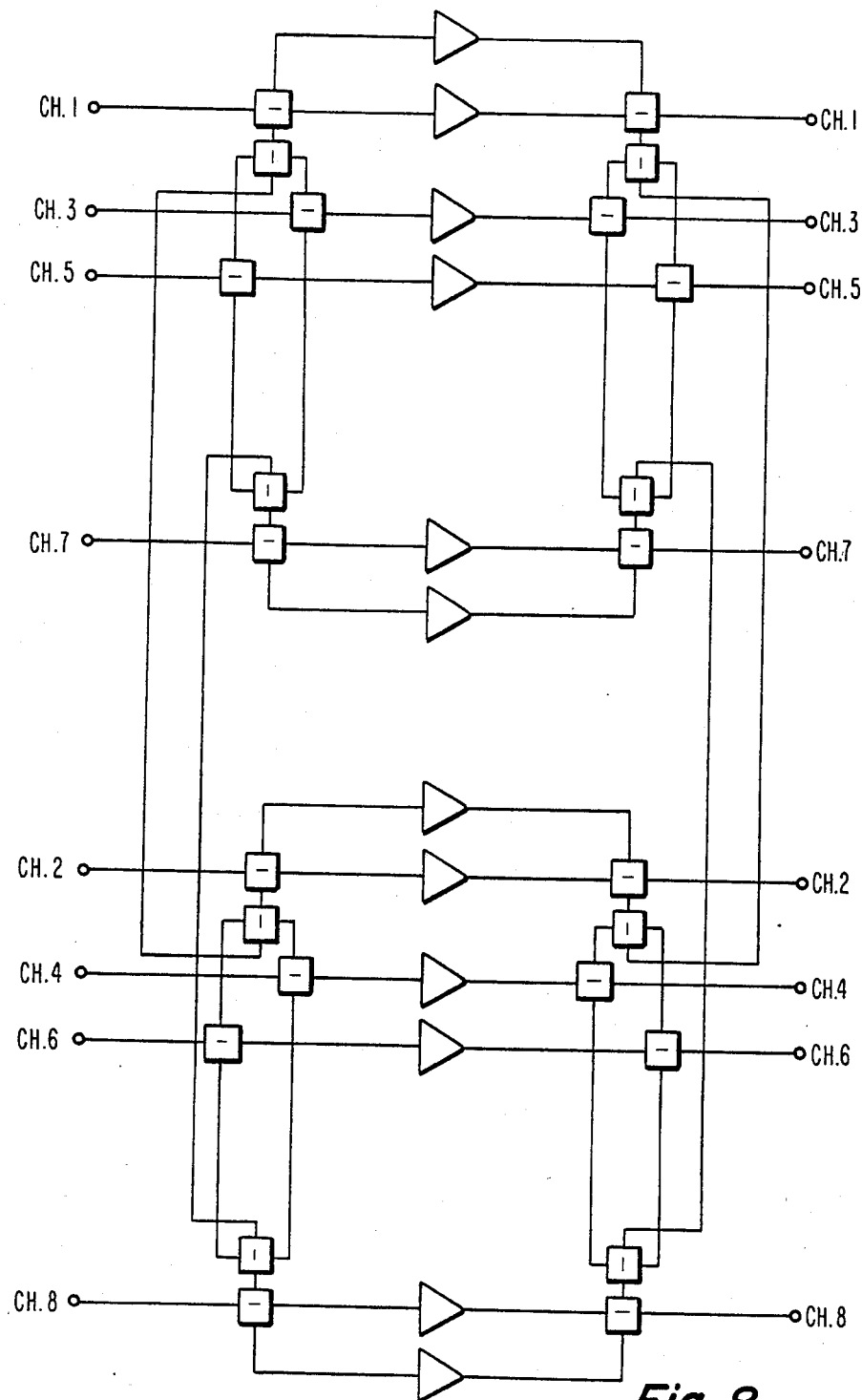
FIG. 8 is a schematic illustration of a redundancy system having eight channels and twelve devices in accordance with the present invention.

A eight channel system may be provided by eliminating the switches and devices of channels 7, 8, 9 and 10 of FIG. 2. Such an eight channel redundancy system is shown in FIG. 8 where the switches and devices of channels 7, 8, 9 and 10 of FIG. 2 have been eliminted to leave eight channels.

The channels suggested for elimination are selected to keep the number of intermediate switches in the two sections of a network as close to equal as possible, to avoid having the two interconnection switches in a given section directly connected to each other and to maintain the pattern of locating all odd-numbered channels in the upper section and all even-numbered channels in the lower section.

What is claimed is:

1. A redundancy system comprising:
   N input ports, where $8 \leq N \leq 12$;
   N+4 devices;
   N+4 switches connected as an input switching network for connecting each of said N input ports to a different one of said N+4 devices, each of said switches having a port 1, a port 2, a port 3, and a port 4 and having a through position in which its port 1 is connected to its port 3, and two transfer positions in one of which its port 1 is connected to its port 2 and its port 3 is connected to its port 4 and in the other of which its port 1 is connected to its port 4 and its port 3 is connected to its port 2;
   said switching network having first and second interconnected sections, each including at least six and not more than eight of said switches;
   each of said sections having all but two of its switches connected together, even-numbered port to even-numbered port, to form a ring,
   said two switches in each section which are not connected in its ring being referred to as appendage switches;
   two of said switches in each of said rings being referred to as interconnection switches, each of said interconnection switches having a first one of its odd-numbered ports connected to a first one of the odd-numbered ports of a corresponding one of said interconnection switches in said other section;
   in each of said rings those switches which are not interconnection switches being referred to as intermediate switches and each being connected to at least one of said interconnection switches in its own ring;
   each of said interconnection switches being connected to two of said intermediate switches in its own ring;
   each of said appendage switches having a first one of its even-numbered ports connected to the second odd-numbered port of a different one of said interconnection switches in its section;
   each of said appendage and intermediate switches in said input switching network having a first one of its odd-numbered ports connected as one of said N input ports of said redundancy system; and
   the second odd-numbered port of each of said intermediate switches, the second even-numbered port and the second odd-numbered port of each of said appendage switches each being connected to the input port of a different one of said N+4 devices.

2. The system recited in claim 1 wherein:
   N is eleven;
   one of said rings includes three intermediate switches, with one of said three intermediate switches in that ring being connected to both of said interconnection switches in that ring.

3. The system recited in claim 1 wherein:
   N is ten;
   each of said rings includes three intermediate switches, with one of said three intermediate switches in each ring being connected to both of said interconnection switches in that ring.

4. The system recited in claim 1 wherein:
   N is nine;
   one of said rings includes three intermediate switches, with one of said three intermediate switches in that ring being connected to both of said interconnection switches in that ring; and
   the other of said rings includes two intermediate switches, each of which is connected to both of said interconnection switches in that ring.

5. The system recited in claim 1 wherein:
   N is eight;
   each of said rings includes two intermediate switches, each of which is connected to both of said interconnection switches in its ring.

6. The redundancy switching system recited in claim 1 further comprising:
   an output switch network of N+4 switches interconnected in the same manner as said input network;
   each of said appendage and intermediate switches in said output switching network having a first one of its odd-numbered ports connected as one of said N output ports of said redundancy system; and
   the second odd-numbered port of each of said intermediate switches, the second even-numbered port and the second odd-numbered port of each of said appendage switches each being connected to the output port of a different one of said N+4 devices.

7. The system recited in claim 6 wherein:
   N is eleven;
   one of said rings includes three intermediate switches, with one of said three intermediate switches in that ring being connected to both of said interconnection switches in that ring.

8. The system recited in claim 6 wherein:
   N is ten;

each of said rings includes three intermediate switches, with one of said three intermediate switches in each ring being connected to both of said interconnection switches in that ring.

9. The system recited in claim 6 wherein:

N is nine;

one of said rings includes three intermediate switches, with one of said three intermediate switches in that ring being connected to both of said interconnection switches in that ring; and the other of said rings includes two intermediate switches, each of which is connected to both of said interconnection switches in that ring.

10. The system recited in claim 6 wherein:

N is eight;

each of said rings includes two intermediate switches, each of which is connected to both of said interconnection switches in its ring.

11. The system recited in claim 6 wherein:

N is 12; and each of said rings includes four intermediate switches.

12. The system recited in claim 1 wherein:

N is 12;

each of said rings includes four intermediate switches.

* * * * *